(12) United States Patent
Choi et al.

(10) Patent No.: US 7,212,001 B2
(45) Date of Patent: May 1, 2007

(54) FLUXGATE SENSOR INTEGRATED HAVING PICK-UP COIL MOUNTED ON EXCITATION COIL IN PRINTED CIRCUIT BOARD AND METHOD FOR MANUFACTURING THE SAME

(75) Inventors: Won-youl Choi, Suwon (KR); Byeong-cheon Koh, Sungnam (KR); Kyung-won Na, Yongin (KR); Sang-on Choi, Suwon (KR); Myung-sam Kang, Chungchongnam-do (KR); Keon-yang Park, Chungchongnam-do (KR)

(73) Assignee: Samsung Electro_Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/228,965

(22) Filed: Aug. 28, 2002

(65) Prior Publication Data

US 2003/0173962 A1    Sep. 18, 2003

(30) Foreign Application Priority Data

Mar. 13, 2002    (KR) ............................... 2002-13524

(51) Int. Cl.
G01R 33/04    (2006.01)
(52) U.S. Cl. ....................................... 324/253; 324/249
(58) Field of Classification Search ......... 324/244–262
See application file for complete search history.

(56) References Cited

U.S. PATENT DOCUMENTS 4,272,724 A * 6/1981 Wada et al. ................. 324/253

(Continued)

FOREIGN PATENT DOCUMENTS

DE        2224124      * 12/1977

(Continued)

OTHER PUBLICATIONS

O. Dezuari, Printed Circuit Board Integrated Fluxgate Sensor, 2000, Elsevier Science S.A. (2000) Sensors and Actuators, pp. 200-203.*

(Continued)

*Primary Examiner*—Jay M. Patidar
(74) *Attorney, Agent, or Firm*—Sughrue Mion, PLLC (57) ABSTRACT

A fluxgate sensor is integrated in a printed circuit board. The fluxgate sensor has two bar-type(or rectangular-ring shaped) soft magnetic cores to form a closed magnetic path on a printed circuit board and an excitation coil in the form of a metal film is wound around the two bar-type soft magnetic cores either in a united structure that winds the two bar-type soft magnetic cores altogether, or in a separated structure that winds the two bar-type soft magnetic cores respectively, both in a pattern of number '8'. A pick-up coil is mounted on the excitation coil, either winding the two bars altogether, or respectively, in a solenoid pattern. The fluxgate sensor integrated in the printed circuit board can be mass-produced at a cheap manufacturing cost. The fluxgate sensor also can be made compact-sized, and at the same time, is capable of forming a closed-magnetic path. As a result, flux leakage is minimized, and the fluxgate sensor has a high sensitivity as it detects the magnetic field through a variable driving.

13 Claims, 8 Drawing Sheets

U.S. PATENT DOCUMENTS

| | | | | |
|---|---|---|---|---|
| 4,864,238 | A | * | 9/1989 | Seitz ........................ 324/253 |
| 4,901,178 | A | * | 2/1990 | Kobayashi et al. ......... 360/126 |
| 4,995,165 | A | * | 2/1991 | Daniels ...................... 33/361 |
| 5,199,178 | A | * | 4/1993 | Tong et al. .................. 33/361 |
| 5,450,263 | A | * | 9/1995 | Desaigoudar et al. ....... 360/110 |
| 5,672,967 | A | * | 9/1997 | Jensen et al. ............... 324/253 |
| 6,270,889 | B1 | * | 8/2001 | Kataoka et al. ............. 428/352 |
| 6,278,272 | B1 | * | 8/2001 | Scarzello et al. ........... 324/253 |
| 6,407,547 | B1 | * | 6/2002 | Yamada et al. ............. 324/253 |
| 6,411,086 | B1 | * | 6/2002 | Choi et al. .................. 324/253 |
| 6,414,564 | B1 | * | 7/2002 | Mizoguchi et al. .......... 333/35 |
| 6,417,665 | B1 | * | 7/2002 | Scarzello et al. ........... 324/253 |
| 6,483,304 | B1 | * | 11/2002 | Kou et al. ................... 324/258 |
| 6,690,164 | B1 | * | 2/2004 | Fedeli et al. ................ 324/253 |
| 2001/0030537 | A1 | * | 10/2001 | Honkura et al. ............. 324/249 |
| 2002/0013005 | A1 | * | 1/2002 | Rhee ............................ 438/3 |

FOREIGN PATENT DOCUMENTS

| | | | |
|---|---|---|---|
| GB | 2339294 | * | 1/2000 |
| JP | 48-34576 | | 5/1973 |
| JP | 01-219580 | | 9/1989 |
| JP | 07-147464 | | 6/1995 |
| JP | 08-179023 | | 7/1996 |
| JP | 08-285929 | | 11/1996 |
| JP | 11-118892 | | 4/1999 |
| JP | 2001-358419 | | 12/2001 |

OTHER PUBLICATIONS

Dezuari O et al: "New Hybrid Technology for Planar Fluxgate Sensor Fabrication" IEEE Transactions on Magnetics, IEEE Service Center, New York, NY, US, vol. 35, No. 4, Jul. 1999, pp. 8111-8117, XP000832168.

Liakopoulos T M et al: "A micro-fluxgate magnetic sensor using micromachined planar solenoid coils" Sensors and Actutators A, Elsevier Sequoia S.A., Lausanne, CH, vol. 77, No. 1, Sep. 28, 1999, pp. 66-72, XP004244548.

Gottfried-Gottfried R et al: "A Miniaturized Mangetic-Field Senosr System Consisting of a Planar Fluxgate Sensor and a CMOS Readout Circuitry" Sensors and Actuators A, Elsevier Sequoia S.A., Lausanne, CH, vol. A54, No. 1/3, Jun. 1996, pp. 443-446, XP000637151.

* cited by examiner

FLUXGATE SENSOR INTEGRATED HAVING PICK-UP COIL MOUNTED ON EXCITATION COIL IN PRINTED CIRCUIT BOARD AND METHOD FOR MANUFACTURING THE SAME

BACKGROUND OF THE INVENTION

1. Field of the Invention

The present invention generally relates to a fluxgate sensor, and more particularly, to a fluxgate sensor integrated in a printed circuit board and a manufacturing method thereof. The present application is based on Korean Patent Application No. 2002-13524, filed Mar. 13, 2002, which is incorporated herein by reference.

2. Description of the Prior Art

Existence of magnetic energy has been proven through various physical phenomena, and a fluxgate sensor enables a human to indirectly perceive the magnetic energy, as it is unperceivable to human sense organs such as eyes and ears. As for the fluxgate sensor, a magnetic sensor employing a soft magnetic coil has been used for a long time. The magnetic sensor is made by winding a coil around a relatively large bar-shaped core or an annular core formed of a soft magnetic ribbon. Also, an electronic circuit is employed to obtain a magnetic field in proportion to the measured magnetic field.

The conventional fluxgate sensor, however, has the following problems. That is, due to the structure of the conventional fluxgate sensor in which the coil is wound around the large bar-shaped core or the annular core made of the soft magnetic ribbon, production costs are high, and the volume of the overall system is large. Also, flux leakage is inevitable in the flux change due to the excitation coil and the detected magnetic field. Accordingly, high sensitivity cannot be guaranteed.

SUMMARY OF THE INVENTION

The present invention has been made to overcome the above-mentioned problems of the prior art. Accordingly, it is an object of the present invention to provide a high sensitivity fluxgate sensor integrated in a printed circuit board which is capable of not only reducing overall volume of a system, but also detecting a magnetic field with more accuracy, and a manufacturing method for manufacturing such a high sensitive fluxgate sensor.

Another object of the present invention is to prevent an induction wave in a flux change detecting coil when the external magnetic field is measured as zero (0).

The above objects are accomplished by a fluxgate sensor according to the present invention, comprising: a soft magnetic core formed on a printed circuit board to form a closed-magnetic path; an excitation coil formed as a metal film wound around the soft magnetic core; and a pick-up coil formed as a metal film formed on the excitation coil, winding the soft magnetic core.

The soft magnetic core is formed as two bars that are placed on the same plane in parallel relation. The bars are positioned such that the length of the bars lies in the direction of magnetic field detection. Alternatively, the soft magnetic core can also be formed as a rectangular-ring. Like the bar-type soft magnetic core, the rectangular-ring type core is also positioned such that its length lies in the direction of magnetic field detection.

The excitation coil can have a structure of alternately winding the two bar-type soft magnetic cores substantially in a number '8' pattern. Alternatively, the excitation coil can also have a structure of winding the two bar-type soft magnetic cores, respectively, and substantially in a solenoid pattern.

When the soft magnetic core is formed as the rectangular-ring, the excitation coil can alternately wind two longer sides of the rectangular-ring type soft magnetic core in the direction of magnetic field detection either altogether or respectively, and substantially in a number '8' pattern.

The excitation coil can wind the two bar-type soft magnetic cores or the two longer sides of the rectangular-ring type soft magnetic core in the direction of magnetic field detection altogether and substantially in a number '8' pattern, or wind the two bar-type soft magnetic cores or the two longer sides of the rectangular-ring type soft magnetic core, respectively, and in the solenoid pattern, and the pick-up coil is mounted on such excitation coil, having a structure of winding the two bar-type soft magnetic cores or the two longer sides of the rectangular-ring type soft magnetic core altogether and substantially in a solenoid pattern. Alternatively, the excitation coil can wind the two bar-type soft magnetic cores or the two longer sides of the rectangular-ring type soft magnetic core in the direction of magnetic field detection altogether and substantially in a number '8' pattern, or wind the two bar-type soft magnetic cores of the two longer sides of the rectangular-ring type soft magnetic core, respectively, in a solenoid pattern, while the pick-up coil has a structure mounted on such excitation coil, having a structure of winding the two bar-type soft magnetic cores or the two longer sides of the rectangular-ring type soft magnetic core, respectively, and substantially in a solenoid pattern.

The above objects are also accomplished by a manufacturing method of a fluxgate sensor according to the present invention, including the steps of: bonding a prepreg and a soft magnetic film on a first metal plate; forming a soft magnetic core by etching the soft magnetic film; forming a first substrate by bonding a prepreg and a second metal plates on an upper portion of the soft magnetic core; forming first via holes in the first substrate, at locations distanced from one and the other sides of the soft magnetic core; metal-plating the first via hole; forming an excitation coil on both surfaces of the substrate by etching; forming a second substrate by bonding a prepreg and third metal plates on an both portions of the excitation coil; forming second via holes in the second substrate, corresponding to the first via holes; metal-plating the second via holes; forming a pick-up coil by etching both surfaces of the second substrate; forming a third substrate by bonding a prepreg and fourth metal plates on both portions of the pick-up coil; and forming a pad for an electrical conductivity, by etching both surfaces of the third substrate.

Preferably, further provided is the step of forming a pattern for the respective components of the fluxgate sensor prior to forming the components, with a photosensitive paint and an exposure. Also provided is the step of metal-plating the pad with gold.

According to the present invention, by forming a soft magnetic core along a direction of detection, counter-magnetic properties can be reduced, while there is no induction wave in a flux change detecting coil due to the structure in which a pick-up coil is mounted on an excitation coil that is wound around the soft magnetic core.

BRIEF DESCRIPTION OF THE DRAWINGS

The above-mentioned objects and the feature of the present invention will be more apparent by describing the preferred embodiments of the present invention by referring to the appended drawings, in which.

DETAILED DESCRIPTION OF THE PREFERRED EMBODIMENTS

From now on, the present invention will be described in greater detail by referring to the appended drawings.

Figure 1:
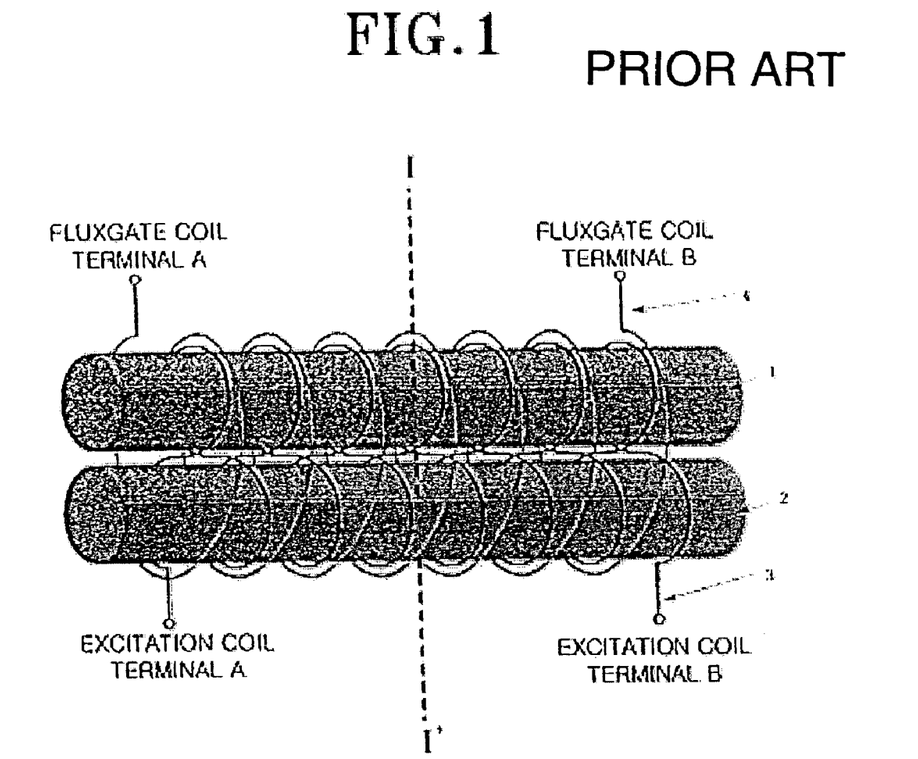
FIG. 1 is a conceptual diagram showing a conventional fluxgate sensor.

FIG. 1 is a conceptual view showing a conventional fluxgate sensor integrated into a printed circuit board. Although preferred embodiments of the present invention may have the same conceptual structure of the conventional fluxgate sensor shown in FIG. 1, the method of manufacture and physical structure of the fluxgate sensor according to the preferred embodiments of the present invention differ from that of the conventional fluxgate sensor. The fluxgate sensor has a first and a second bar-type soft magnetic cores 1 and 2 with an excitation coil 3 being wound around the first and second bar-type soft magnetic cores 1 and 2 substantially in the pattern of number '8', and a pick-up coil 4 wound around the excitation coil 3, the first and second bar-type soft magnetic cores 1 and 2.

Hereinafter, the winding structure, in which a coil is wound around the two bar-type soft magnetic cores altogether in the number '8' pattern, will be called a 'united structure'. And the same winding structure on the rectangular-ring type soft magnetic core according to the second preferred embodiment will also be called a 'united structure'. Meanwhile, the winding structure having a coil that winds the two bar-type soft magnetic cores, respectively, or that winds the two longer sides of a rectangular-ring type soft magnetic core, respectively, will be called a 'separated structure'.

Figure 2:
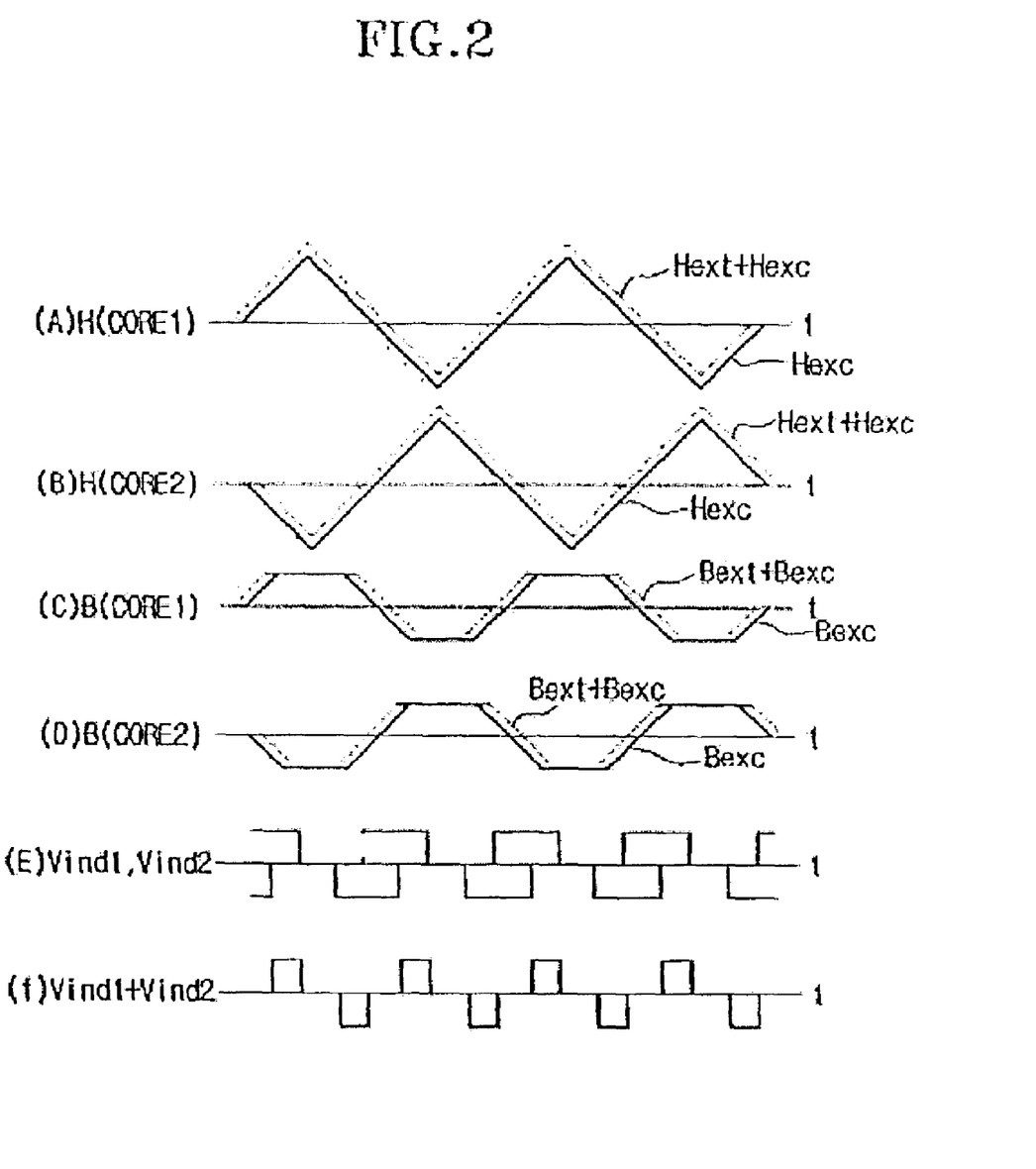
FIGS. 2A through 2F are waveforms for illustrating the operation of the fluxgate sensor of FIG. 1.

FIGS. 2A through 2F are timing views for explaining the operation of the fluxgate sensor of FIG. 1. FIG. 2A is a waveform of a magnetic field generated from a first soft magnetic core 1, FIG. 2B is a waveform of a magnetic field generated from a second soft magnetic core 2, FIG. 2C is a waveform of a flux density generated from the first soft magnetic core 1, FIG. 2D is a waveform of a flux density generated from the second soft magnetic core 2, and FIGS. 2E and 2F are waveforms for respectively showing first and second induction voltages Vind1 and Vind2 induced at the pick-up coil, and a sum of adding the first and second induction voltages Vind1+Vind2.

With the excitation coil 3 winding the first and second bar-type soft magnetic cores 1 and 2 altogether in the pattern of number '8' (FIG. 1), and with the supply of AC excitation current, the internal magnetic field (Hext+Hexc) and the flux density (Bext+Bexc) at the first bar-type soft magnetic core 1 and the internal magnetic field (Hext−Hexc) and the flux density (Bext−Bexc) at the second bar-type soft magnetic core 2 act in opposite directions (See FIGS. 2A, 2B, 2C, 2D). Here, Hext is the external magnetic field, Hexc is the magnetic field by excitation coil, Bext is the flux density by external magnetic field and Bexc is the flux density by the excitation coil. The pick-up coil 4 is wound to gain the sum of the flux generated from each of the first and second bar-type soft magnetic cores 1 and 2, and detects the changes in the flux by the electronic induction by the AC excitation current. Since the internal magnetic fields of the first and second bar-type soft magnetic cores 1 and 2 are in opposite directions, the induction voltage detected at the pick-up coil 4 is the result of offsetting the two symmetrically generated induction voltages Vind1 and Vind2 (FIG. 2F). More specifically, since the external magnetic field Hext is applied to the first and second bar-type soft magnetic cores 1 and 2 in the same direction, the internal magnetic fields of the first and second cores 1 and 2 are Hext+Hexc and Hext−Hexc. At this time, as shown in FIG. 2E, voltages Vind1 and Vind2 are induced at the pick-up coil 4, and the magnitude of the external magnetic field Hext is obtained by detecting the sum of such induction voltages Vind1 and Vind2.

As it could be noted from the above, regarding the construction of the fluxgate sensor integrated into the printed circuit board, it is most important to have the appropriate bonding structure of the excitation coil 3 having the united structure in a number '8' pattern, and the pick-up coil 4 winding the first and second bar-type soft magnetic cores 1 and 2 in a solenoid pattern, to have the sum of the flux changes in the first and second bar-type soft magnetic cores 1 and 2. Here, the pick-up coil 4 can also be formed on the excitation coil 3, separately winding the first and second bar-type soft magnetic cores 1 and 2. This is because the structure of the fluxgate sensor described above offsets the induction waves of the magnetic field generated from the first and second bar-type soft magnetic cores 1 and 2 in the absence of the external magnetic field Hext, with the flux generated by the excitation coil forming a closed-magnetic path at the first and second bar-type soft magnetic cores 1 and 2.

Meanwhile, the soft magnetic cores of FIG. 1 can take the form of a rectangular-ring. And this can also provide the same benefit as the bar-type soft magnetic cores, with the structure of the excitation coil winding the two longer sides of the rectangular-ring type soft magnetic core in the number '8' pattern, and the pick-up coil winding the two longer sides in a solenoid pattern. Alternatively, the pick-up coil can be wound around the two longer sides of the rectangular-ring, separately.

The detection of magnetic field is also possible by the structure of a single bar-type soft magnetic core being arranged with the excitation coil and the pick-up coil. This case, however, requires more complicated signal processing of the output from the detecting coil like amplification and filtering, because there are induction voltage waves generated at the detection coil by the larger excitation coil even in the absence of the external magnetic field. Accordingly, using the two bar-type soft magnetic cores, or a single rectangular-ring type core will provide more advantages especially in terms of signal processing requirements.

FIGS. 3A through 3M are views taken on line I—I of FIG. 1, showing the processes of mounting the fluxgate sensor in the printed circuit board.

Figure 3:
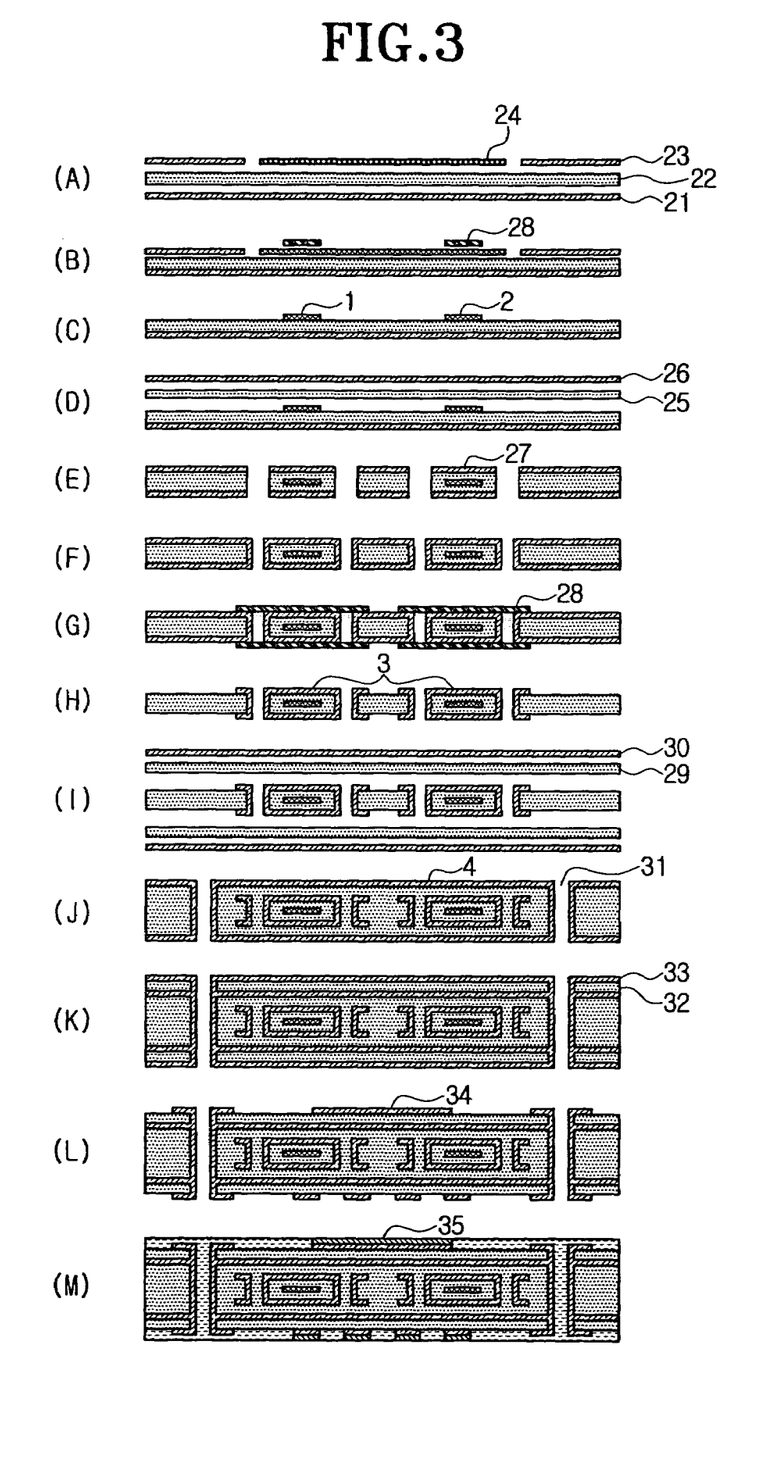
FIGS. 3A through 3M are sectional views taken along line I—I of FIG. 1, showing a manufacturing process of the fluxgate sensor.

First, a prepreg 22 and a soft magnetic film 24 are bonded on a first copper foil 21 (FIG. 3A). Then, by using a photosensitive paint 28 and an exposure, a pattern for the soft magnetic cores 1 and 2 is formed (FIG. 3B). Then, by subjecting the soft magnetic film 24 to an etching process using the photosensitive paint 28, the soft magnetic cores 1 and 2 are shaped (FIG. 3C). The soft magnetic cores 1 and 2 are formed such that the length thereof is in the direction of the magnetic field detection. Next, a prepreg 25 and a copper foil 26 are bonded on the upper portion of the first and second soft magnetic cores 1 and 2 (FIG. 3D). Then, by drilling, first via holes 27 are formed through a first substrate consisting of the first and the second soft magnetic cores 1 and 2, with the first soft magnetic core 1 and the second soft magnetic core 2 positioned therebetween, respectively (FIG. 3E), and then the walls of the first via holes 27 are metal-plated (FIG. 3F). After that, by using a photosensitive paint 28 and exposure on both sides of the external copper foil, an excitation coil pattern is formed (FIG. 3G). Then the excitation coil wiring is formed by subjecting the copper foil 26 to an etching process using the photosensitive paint (3H). The excitation coil is formed to have the united structure, winding the first and second soft magnetic cores 1 and 2 altogether substantially in a number '8' pattern. Then a prepreg 29 and a copper foil 30 are attached to both sides of the excitation coil (FIG. 3I). Next, second via holes 31 are formed in correspondence to the first via holes 27, and the walls of the second via holes 31 are metal-plated. Then a pick-up coil wiring is formed using the photosensitive paint and an exposure (FIG. 3J). The pick-up coil 4 has a structure formed on the excitation coil, winding the first and second bar-type soft magnetic cores 1 and 2 altogether and substantially in the solenoid pattern. Then, a prepreg 32 and a copper plate 33 are attached (FIG. 3K), and a pad 34 is formed through the exposure and etching for conductivity with the outside (FIG. 3L). The copper pad 34 is metal-plated with gold 35 (FIG. 3M).

Figure 4A:
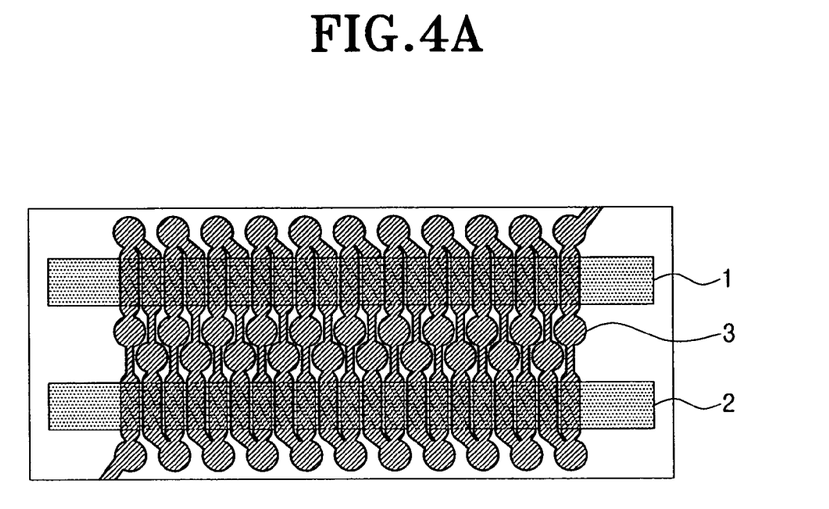
FIG. 4A is a plan view showing two bar-type soft magnetic cores arranged on a same plane in parallel relation, and an excitation coil of the united structure winding the two bar-type soft magnetic cores altogether substantially in a number '8' pattern.
Figure 4B:
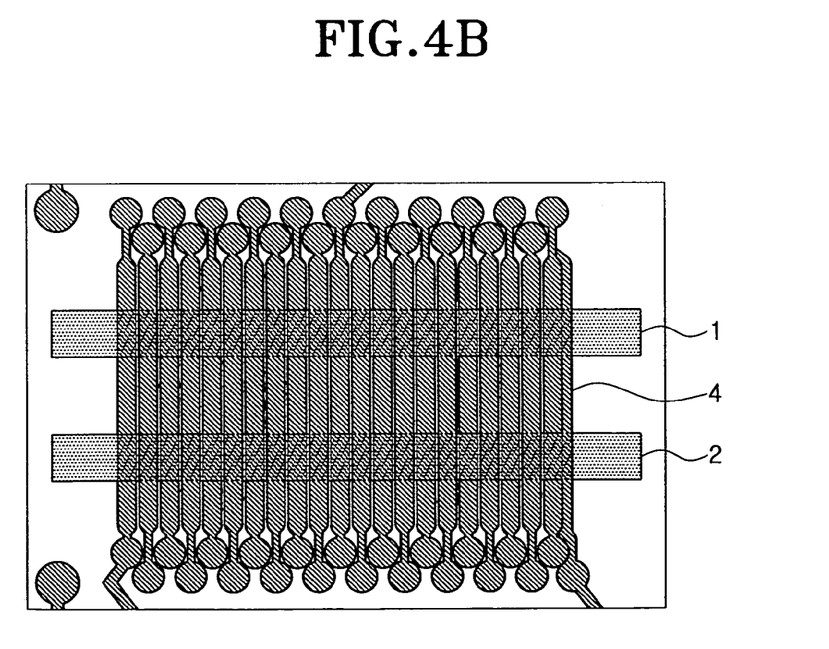
FIG. 4B is a plan view showing a pick-up coil being formed on the two bar-type soft magnetic cores of FIG. 4A substantially in a solenoid pattern.
Figure 4C:
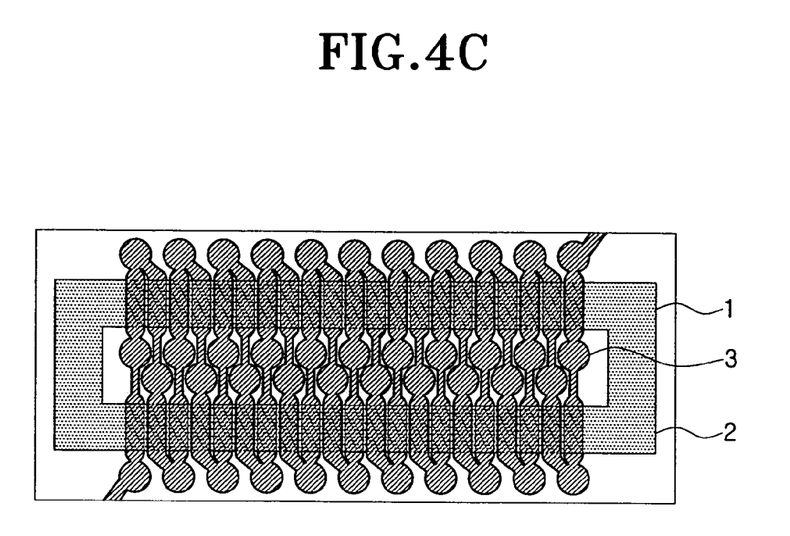
FIG. 4C is a plan view showing a soft magnetic core of a rectangular-ring shape arranged on a same plane, and an excitation coil of the united structure winding the rectangular-ring type soft magnetic coil.
Figure 4D:
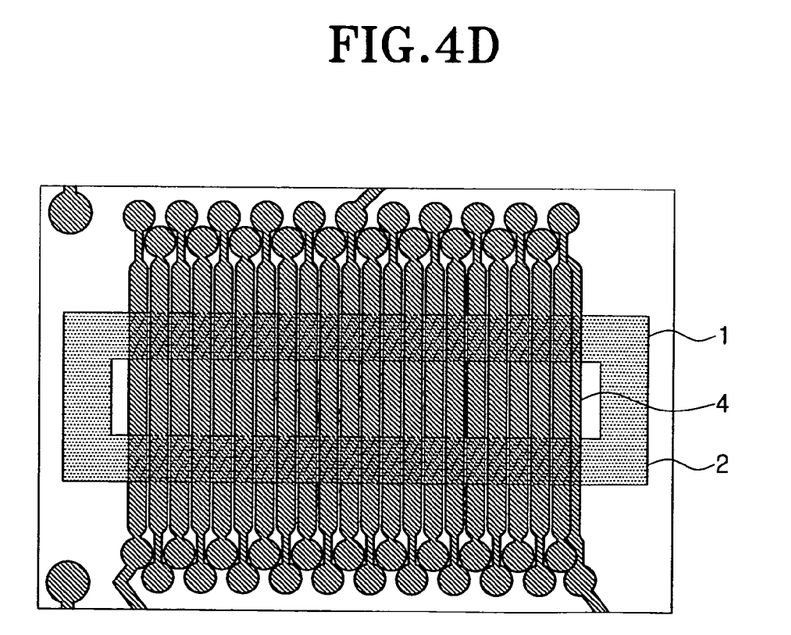
FIG. 4D is a plan view showing a pick-up coil being arranged on the soft magnetic core of FIG. 4C substantially in a solenoid pattern.

FIGS. 4A and 4B are plan views of the fluxgate sensor on the printed circuit board according to the first preferred embodiment of the present invention, FIG. 4A is a plan view showing the two bar-type soft magnetic cores placed on the same plane in parallel relation, with the excitation coil of the united structure winding the two bar-type soft magnetic cores altogether, and FIG. 4B is a plan view showing the pick-up coil being wound around the soft magnetic cores substantially in the solenoid pattern. FIG. 4C is a plan view showing a rectangular-ring type soft magnetic core placed on the same plane, with the excitation coil of the united structure winding the rectangular-type soft magnetic core, and FIG. 4D is a plan view showing the pick-up coil formed on the rectangular-ring type soft magnetic core of FIG. 4C substantially in a solenoid pattern.

Figure 5:
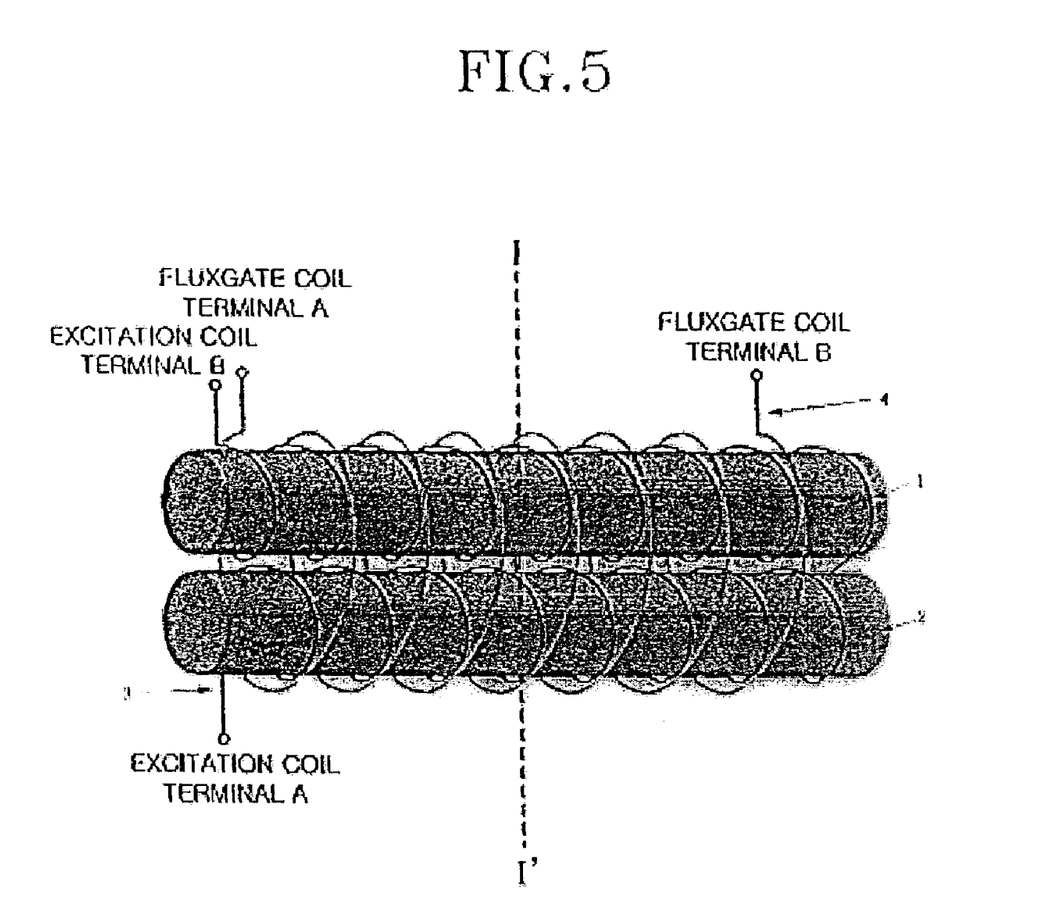
FIG. 5 is a typical diagram showing a fluxgate sensor integrated in a printed circuit board according to a second preferred embodiment of the present invention.

FIG. 5 is a view showing the fluxgate sensor integrated in the printed circuit board according to the second preferred embodiment of the present invention. In the fluxgate sensor, there are first and second bar-type soft magnetic cores 1 and 2 placed in parallel with each other, and an excitation coil 3 is separately wound around each of the first and second soft magnetic cores 1 and 2. In other words, the excitation coil 3 has the separated structure. A pick-up coil 4 is wound on the excitation coil 3, around the first and second bar-type soft magnetic cores 1 and 2 altogether. Alternatively, the pick-up coil 4 can be wound on the excitation coil 3, winding the first and second bar-type soft magnetic cores 1 and 2, respectively.

Meanwhile, the soft magnetic cores can take the form of a rectangular-ring, and in this case, the excitation coil 3 can separately wind the two longer sides of the rectangular-ring type soft magnetic core in the direction of magnetic field detection, and the pick-up coil 4 is wound around the two longer sides of the rectangular-ring type soft magnetic core altogether and substantially in the solenoid pattern, to achieve the same benefit of induction voltage offset. Alternatively, the pick-up coil 4 can be separately wound around the two longer sides of the rectangular-ring type soft magnetic core in the solenoid pattern.

Here, the induction voltage detected at the pick-up coil 4 according to the second embodiment is similar to the induction voltage detected at the excitation coil of the united structure according to the first embodiment, i.e., the same benefit of offsetting of induction voltage when the external magnetic field is zero (0) is expected in both of the first and second embodiments.

Figure 6A:
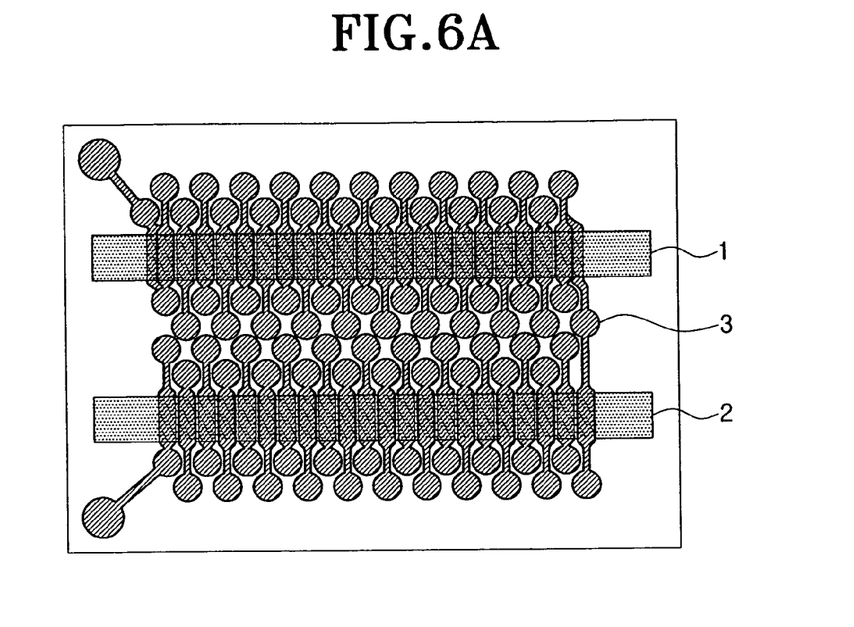
FIG. 6A is a plan view showing two bar-type soft magnetic cores placed on a same plane in parallel relation, and an excitation coil of the separated structure winding the two bar-type soft magnetic cores, respectively.
Figure 6B:
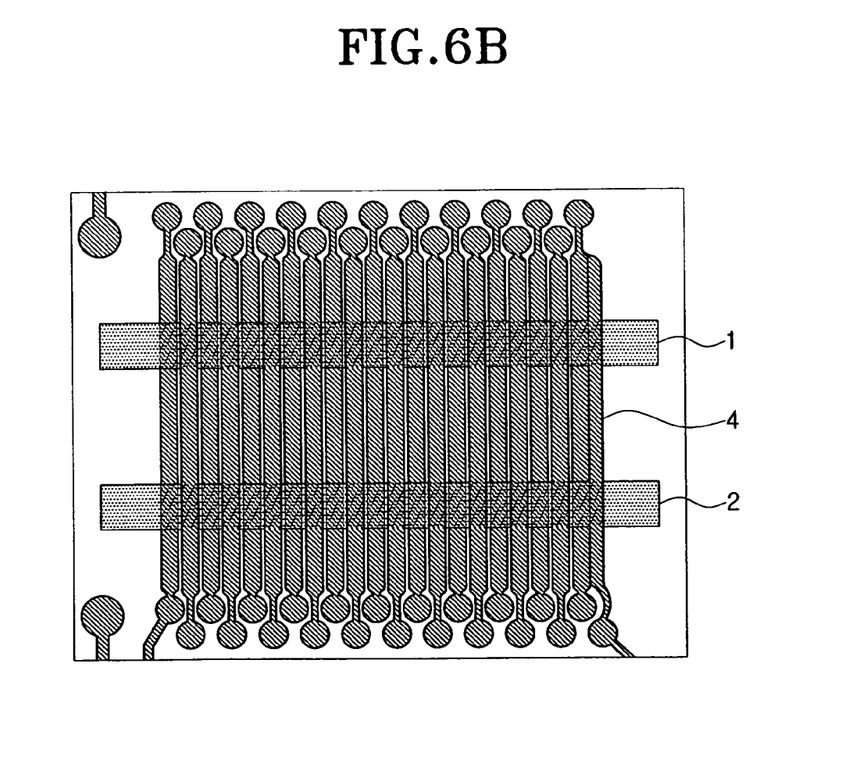
FIG. 6B is a plan view showing a pick-up coil winding the two bar-type soft magnetic cores of FIG. 6A substantially in a solenoid pattern.
Figure 6C:
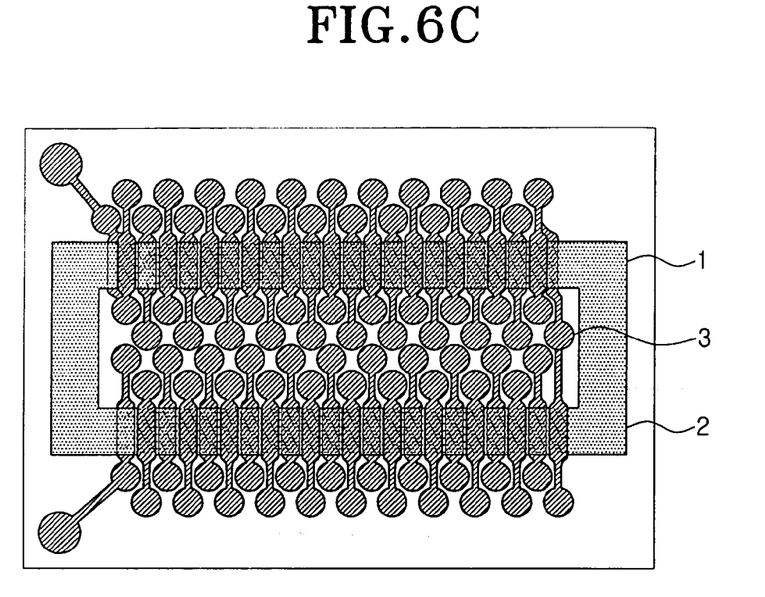
FIG. 6C is a plan view showing a rectangular-ring type soft magnetic core placed on a same plane, and an excitation coil of the separated structure winding the two longer sides of the rectangular-ring type soft magnetic core, respectively.
Figure 6D:
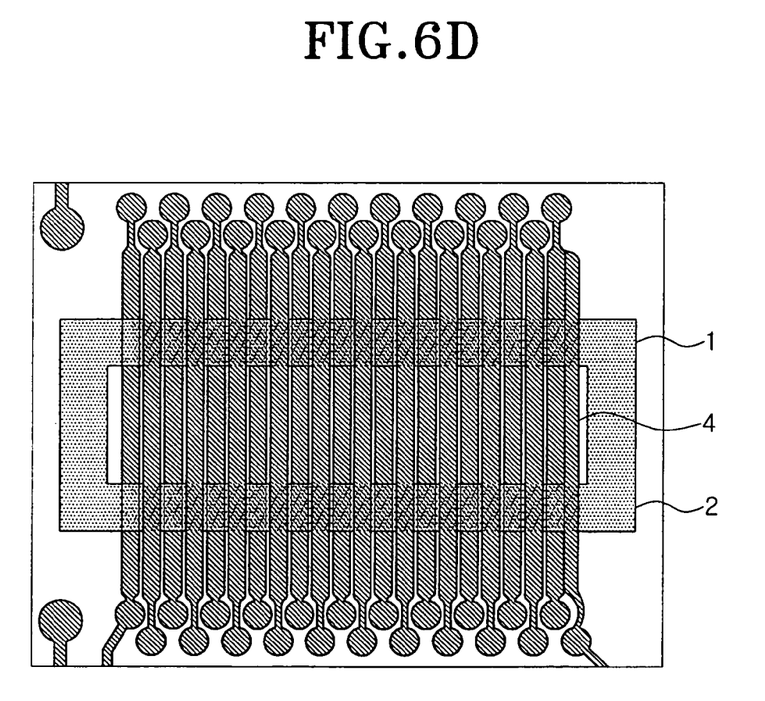
FIG. 6D is a plan view showing a pick-up coil winding the two longer sides of the rectangular-ring type soft magnetic core of FIG. 6C substantially in a solenoid pattern.

FIGS. 6A and 6B are plan views showing the fluxgate sensor in the printed circuit board according to the second preferred embodiment of the present invention. FIG. 6A is a plan view showing two bar-type soft magnetic cores placed on a same plane in parallel relation, and an excitation coil of the separated structure formed on the two soft magnetic cores, and FIG. 6B is a plan view showing a pick-up coil formed on the soft magnetic cores substantially in the solenoid pattern. FIG. 6C is a plan view showing a rectangular-ring type soft magnetic core, with an excitation coil of the separated structure being formed on the rectangular-ring type soft magnetic core, and FIG. 6D is a plan view showing a pick-up coil being formed on the rectangular-ring type soft magnetic core substantially in the solenoid pattern.

The fluxgate sensor described above can be used in various applications, like navigation system by terrestrial magnetism detection, earth magnetism change monitor (earthquake prediction), biological electric measurement, and defect detection in metals. As for the indirect applications, the fluxgate sensor can also be used in a magnetic encoder, contactless potentiometer, electric current sensor, torque sensor, and displacement sensor.

With the fluxgate sensor, which can be integrated in the printed circuit board together with other sensors and circuits, the overall size of a system is reduced greatly. Also, as the voltages induced from the respective cores of sides are driven variably, sensitivity is kept high to detect even a weak external magnetic field.

Also, as the fluxgate sensor according to the present invention can be produced at a cheaper price than the bar-type soft magnetic cores or annular cores, mass-production is enabled.

Although the preferred embodiments of the present invention have been described, it will be understood by those skilled in the art that the present invention should not be limited to the described preferred embodiments, but various changes and modifications can be made within the spirit and scope of the present invention as defined by the appended claims.

What is claimed is:

1. A fluxgate sensor, comprising:
   a soft magnetic core disposed on a printed circuit board to form a closed-magnetic path;
   an excitation coil formed as a metal film wound around the soft magnetic core; and
   a pick-up coil comprising a metal film formed on the soft magnetic core where the excitation coil is wound, said pick-up coil winding the excitation coil and the soft magnetic core; and
   a pad comprising metal film disposed on the pickup coil for providing an external conductive connection,
   wherein the soft magnetic core comprises a rectangular-ring formed such that a length is in a direction of magnetic field detection, and
   wherein the excitation coil alternately winds two longer sides of the rectangular-ring substantially in a number '8' pattern.

2. The fluxgate sensor of claim 1, wherein two longer sides of the rectangular ring are disposed on a same plane in parallel relation.

3. The fluxgate sensor of claim 2, wherein the pick-up coil has a structure formed on the excitation coil, winding the two longer sides of the rectangular ring altogether substantially in a coil pattern.

4. The fluxgate sensor of claim 2, wherein the pick-up coil has a structure formed on the excitation coil, winding the two longer sides of the rectangular ring substantially in a coil pattern.

5. The fluxgate sensor of claim 2, wherein the excitation coil winds the two longer sides of the rectangular ring substantially in a coil pattern.

6. The fluxgate sensor of claim 5, wherein the pick-up coil has a structure formed on the excitation coil, winding the two longer sides of the rectangular ring altogether substantially in a coil pattern.

7. The fluxgate sensor of claim 5, wherein the pick-up coil has a structure formed on the excitation coil, winding the two longer sides of the rectangular ring substantially in a coil pattern.

8. The fluxgate sensor of claim 1, wherein the pick-up coil has a structure formed on the excitation coil, winding the two longer sides altogether substantially in a coil pattern.

9. The fluxgate sensor of claim 1, wherein the pick-up coil has a structure formed on the excitation coil, winding the two longer sides substantially in a coil pattern.

10. The fluxgate sensor of claim 1, wherein the excitation coil winds the two longer sides substantially in a coil pattern.

11. The fluxgate sensor of claim 10, wherein the pick-up coil has a structure formed on the excitation coil, winding the two longer sides altogether substantially in a coil pattern.

12. The fluxgate sensor of claim 10, wherein the pick-up coil has a structure formed on the excitation coil, winding the two longer sides substantially in a coil pattern.

13. The fluxgate sensor of claim 2, wherein the two longer sides of the retangualar ring are formed such that a length is in a direction of magnetic field detection.

* * * * *